(12) United States Patent
Tsai et al.

(10) Patent No.: US 7,219,293 B2
(45) Date of Patent: *May 15, 2007

(54) HIGH PERFORMANCE CRC CALCULATION METHOD AND SYSTEM WITH A MATRIX TRANSFORMATION STRATEGY

(75) Inventors: Kovsky T. J. Tsai, Hsinchu (TW); Joe Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 579 days.

This patent is subject to a terminal disclaimer.

(21) Appl. No.: 10/736,548

(22) Filed: Dec. 17, 2003

(65) Prior Publication Data

US 2005/0149818 A1    Jul. 7, 2005

(51) Int. Cl.
*H03M 13/00* (2006.01)

(52) U.S. Cl. ...................................... 714/757; 714/758

(58) Field of Classification Search ................. 714/758, 714/781, 804, 752; 702/189
See application file for complete search history.

(56) References Cited

U.S. PATENT DOCUMENTS

2005/0066257 A1* 3/2005 Tsai et al. .................... 714/781

* cited by examiner

*Primary Examiner*—Guy J. Lamarre
(74) *Attorney, Agent, or Firm*—Rabin & Berdo, P.C.

(57) ABSTRACT

A CRC calculation method and system for generating a CRC from a message is provided while improving the process time and simple to implement. A linear mapping matrix is used for the operation of the LFSR to generate the CRC and the maximum value of the non-zero entries in the mapping matrix is reduced by applying one or more raw operations to the linear mapping matrix in advance before the computation of mapping the input message to the CRC result. Flip-flops are additionally inserted before the generator matrix to obtain a pipeline architecture so as to further improving the operation speed thereof.

22 Claims, 16 Drawing Sheets

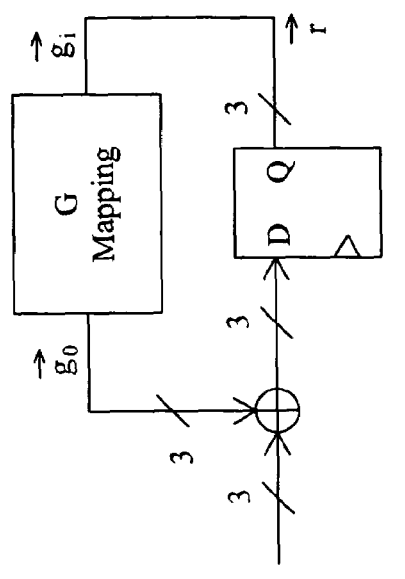
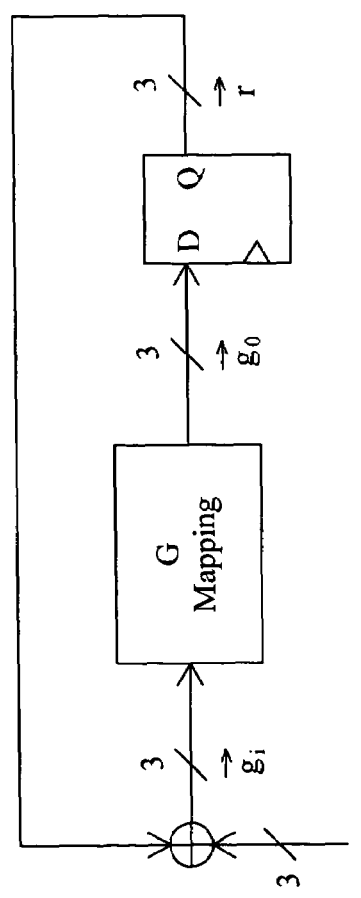
Fig. 2

$$G = \begin{Bmatrix} \text{Row31} & \text{0x40000000} \\ \text{Row30} & \text{0x20000000} \\ \text{Row29} & \text{0x10000000} \\ \text{Row28} & \text{0x08000000} \\ \text{Row27} & \text{0x04000000} \\ \text{Row26} & \text{0x82000000} \\ \text{Row25} & \text{0x01000000} \\ \text{Row24} & \text{0x00800000} \\ \text{Row23} & \text{0x80400000} \\ \text{Row22} & \text{0x80200000} \\ \text{Row21} & \text{0x00100000} \\ \text{Row20} & \text{0x00080000} \\ \text{Row19} & \text{0x00040000} \\ \text{Row18} & \text{0x00020000} \\ \text{Row17} & \text{0x00010000} \\ \text{Row16} & \text{0x80008000} \\ \text{Row15} & \text{0x00004000} \\ \text{Row14} & \text{0x00002000} \\ \text{Row13} & \text{0x00001000} \\ \text{Row12} & \text{0x80000800} \\ \text{Row11} & \text{0x80000400} \\ \text{Row10} & \text{0x80000200} \\ \text{Row9} & \text{0x00000100} \\ \text{Row8} & \text{0x80000080} \\ \text{Row7} & \text{0x80000040} \\ \text{Row6} & \text{0x00000020} \\ \text{Row5} & \text{0x80000010} \\ \text{Row4} & \text{0x80000008} \\ \text{Row3} & \text{0x00000004} \\ \text{Row2} & \text{0x80000002} \\ \text{Row1} & \text{0x80000001} \\ \text{Row0} & \text{0x80000000} \end{Bmatrix}$$

$$G^{-1} = \begin{Bmatrix} \text{Row31} & \text{0x00000001} \\ \text{Row30} & \text{0x80000000} \\ \text{Row29} & \text{0x40000000} \\ \text{Row28} & \text{0x20000000} \\ \text{Row27} & \text{0x10000000} \\ \text{Row26} & \text{0x08000000} \\ \text{Row25} & \text{0x04000001} \\ \text{Row24} & \text{0x02000000} \\ \text{Row23} & \text{0x01000000} \\ \text{Row22} & \text{0x00800001} \\ \text{Row21} & \text{0x00400001} \\ \text{Row20} & \text{0x00200000} \\ \text{Row19} & \text{0x00100000} \\ \text{Row18} & \text{0x00080000} \\ \text{Row17} & \text{0x00040000} \\ \text{Row16} & \text{0x00020000} \\ \text{Row15} & \text{0x00010001} \\ \text{Row14} & \text{0x00008000} \\ \text{Row13} & \text{0x00004000} \\ \text{Row12} & \text{0x00002000} \\ \text{Row11} & \text{0x00001001} \\ \text{Row10} & \text{0x00000801} \\ \text{Row9} & \text{0x00000401} \\ \text{Row8} & \text{0x00000200} \\ \text{Row7} & \text{0x00000101} \\ \text{Row6} & \text{0x00000081} \\ \text{Row5} & \text{0x00000040} \\ \text{Row4} & \text{0x00000021} \\ \text{Row3} & \text{0x00000011} \\ \text{Row2} & \text{0x00000008} \\ \text{Row1} & \text{0x00000005} \\ \text{Row0} & \text{0x00000003} \end{Bmatrix}$$

Fig. 3

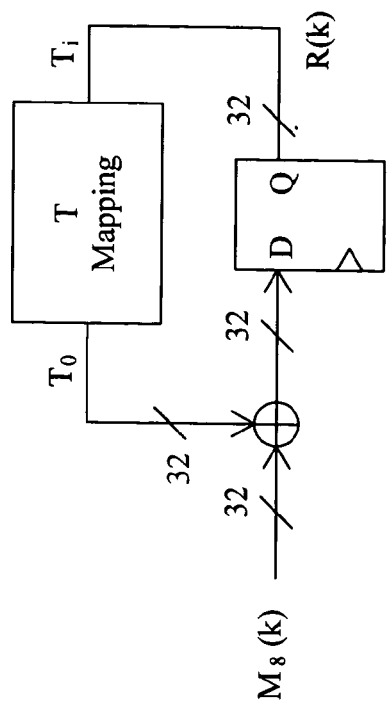
Scheme 2
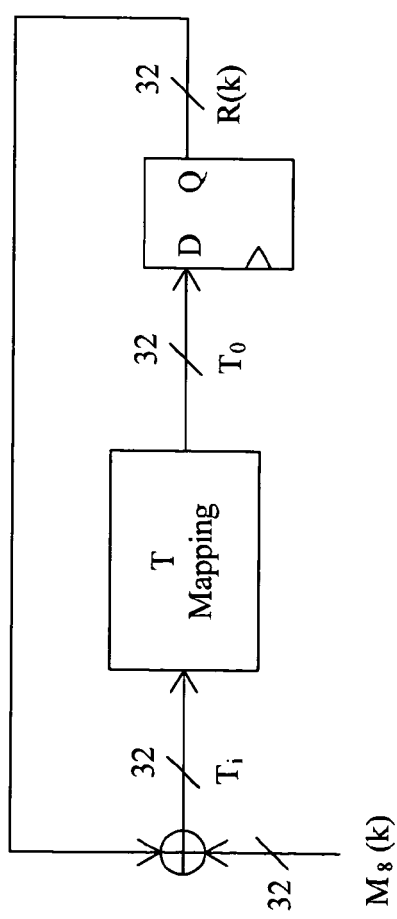
Scheme 1
Fig. 4

$$T = G^8 = \begin{pmatrix} \text{Row31} & \text{0x20800000} \\ \text{Row30} & \text{0x90400000} \\ \text{Row29} & \text{0xc8200000} \\ \text{Row28} & \text{0x64100000} \\ \text{Row27} & \text{0xb2080000} \\ \text{Row26} & \text{0x59040000} \\ \text{Row25} & \text{0x0c020000} \\ \text{Row24} & \text{0x86010000} \\ \text{Row23} & \text{0x43008000} \\ \text{Row22} & \text{0x01004000} \\ \text{Row21} & \text{0x20002000} \\ \text{Row20} & \text{0x10001000} \\ \text{Row19} & \text{0x88000800} \\ \text{Row18} & \text{0xc4000400} \\ \text{Row17} & \text{0x62000200} \\ \text{Row16} & \text{0x31000100} \\ \text{Row15} & \text{0xb8000080} \\ \text{Row14} & \text{0xdc000040} \\ \text{Row13} & \text{0xee000020} \\ \text{Row12} & \text{0x77000010} \\ \text{Row11} & \text{0x1b000008} \\ \text{Row10} & \text{0x2d000004} \\ \text{Row9} & \text{0x36000002} \\ \text{Row8} & \text{0x1b000001} \\ \text{Row7} & \text{0xad000000} \\ \text{Row6} & \text{0xf6000000} \\ \text{Row5} & \text{0xfb000000} \\ \text{Row4} & \text{0x5d000000} \\ \text{Row3} & \text{0x8e000000} \\ \text{Row2} & \text{0xc7000000} \\ \text{Row1} & \text{0xc3000000} \\ \text{Row0} & \text{0x41000000} \end{pmatrix} \begin{matrix} 2 \\ 3 \\ 4 \\ 4 \\ 5 \\ 5 \\ 3 \\ 4 \\ 4 \\ 2 \\ 2 \\ 2 \\ 3 \\ 4 \\ 4 \\ 4 \\ 5 \\ 6 \\ 7 \\ 7 \\ 5 \\ 5 \\ 5 \\ 5 \\ 5 \\ 6 \\ 7 \\ 5 \\ 4 \\ 5 \\ 4 \\ 2 \end{matrix}$$

$$T^{-1} = G^{-8} = \begin{pmatrix} \text{Row31} & \text{0x000000d5} \\ \text{Row30} & \text{0x0000006a} \\ \text{Row29} & \text{0x00000035} \\ \text{Row28} & \text{0x0000001a} \\ \text{Row27} & \text{0x0000000d} \\ \text{Row26} & \text{0x00000006} \\ \text{Row25} & \text{0x000000d6} \\ \text{Row24} & \text{0x0000006b} \\ \text{Row23} & \text{0x80000035} \\ \text{Row22} & \text{0x400000cf} \\ \text{Row21} & \text{0x200000b2} \\ \text{Row20} & \text{0x10000059} \\ \text{Row19} & \text{0x0800002c} \\ \text{Row18} & \text{0x04000016} \\ \text{Row17} & \text{0x0200000b} \\ \text{Row16} & \text{0x01000005} \\ \text{Row15} & \text{0x008000d7} \\ \text{Row14} & \text{0x0040006b} \\ \text{Row13} & \text{0x00200035} \\ \text{Row12} & \text{0x0010001a} \\ \text{Row11} & \text{0x000800d8} \\ \text{Row10} & \text{0x000400b9} \\ \text{Row9} & \text{0x00040089} \\ \text{Row8} & \text{0x00020044} \\ \text{Row7} & \text{0x000080f7} \\ \text{Row6} & \text{0x000040ae} \\ \text{Row5} & \text{0x00002057} \\ \text{Row4} & \text{0x000010fe} \\ \text{Row3} & \text{0x000008aa} \\ \text{Row2} & \text{0x00000455} \\ \text{Row1} & \text{0x000002ff} \\ \text{Row0} & \text{0x000001aa} \end{pmatrix} \begin{matrix} 5 \\ 4 \\ 4 \\ 3 \\ 3 \\ 2 \\ 5 \\ 5 \\ 5 \\ 7 \\ 5 \\ 5 \\ 4 \\ 4 \\ 4 \\ 3 \\ 7 \\ 6 \\ 5 \\ 4 \\ 5 \\ 6 \\ 4 \\ 3 \\ 8 \\ 6 \\ 6 \\ 8 \\ 5 \\ 5 \\ 9 \\ 5 \end{matrix}$$

Fig. 5

$$U_{32} = \begin{Bmatrix} \text{Row31} & \text{0xfb808a20} \\ \text{Row30} & \text{0x7dc04590} \\ \text{Row29} & \text{0xbee022c8} \\ \text{Row28} & \text{0x5e70116d} \\ \text{Row27} & \text{0x2fb809b2} \\ \text{Row26} & \text{0x97dc0459} \\ \text{Row25} & \text{0xb06e8804} \\ \text{Row24} & \text{0x5837448e} \\ \text{Row23} & \text{0xac1ba243} \\ \text{Row22} & \text{0xac8d5b00} \\ \text{Row21} & \text{0xad462620} \\ \text{Row20} & \text{0x57a31311} \\ \text{Row19} & \text{0x2b518888} \\ \text{Row18} & \text{0x95a8c4cc} \\ \text{Row17} & \text{0xcad46262} \\ \text{Row16} & \text{0x646a3130} \\ \text{Row15} & \text{0x483593b9} \\ \text{Row14} & \text{0x249ac8d4} \\ \text{Row13} & \text{0x924d64e6} \\ \text{Row12} & \text{0x6610e0b0} \\ \text{Row11} & \text{0x0fd1ce00} \\ \text{Row10} & \text{0xb4096225} \\ \text{Row9} & \text{0x20843b3f} \\ \text{Row8} & \text{0x91c21c1a} \\ \text{Row7} & \text{0x33e185a5} \\ \text{Row6} & \text{0x627048fe} \\ \text{Row5} & \text{0x313824fb} \\ \text{Row4} & \text{0xe21c9854} \\ \text{Row3} & \text{0x8a0ec786} \\ \text{Row2} & \text{0x4f09a449} \\ \text{Row1} & \text{0x18033bc2} \\ \text{Row0} & \text{0xf6011640} \end{Bmatrix} \begin{matrix} 12 \\ 13 \\ 14 \\ 15 \\ 15 \\ 15 \\ 11 \\ 14 \\ 14 \\ 13 \\ 12 \\ 14 \\ 11 \\ 14 \\ 14 \\ 12 \\ 15 \\ 13 \\ 15 \\ 11 \\ 13 \\ 12 \\ 14 \\ 12 \\ 15 \\ 15 \\ 15 \\ 13 \\ 15 \\ 13 \\ 12 \\ 11 \end{matrix}$$

Fig. 9

$$S_{32} = S_{32}^{-1} = \begin{Bmatrix} \text{Row31} & \text{0x80000000} \\ \text{Row30} & \text{0x40000000} \\ \text{Row29} & \text{0x20000000} \\ \text{Row28} & \text{0x10000000} \\ \text{Row27} & \text{0x08000000} \\ \text{Row26} & \text{0x04000000} \\ \text{Row25} & \text{0x02000000} \\ \text{Row24} & \text{0x01000000} \\ \text{Row23} & \text{0x00800000} \\ \text{Row22} & \text{0x00400000} \\ \text{Row21} & \text{0x00200000} \\ \text{Row20} & \text{0x00100000} \\ \text{Row19} & \text{0x00080000} \\ \text{Row18} & \text{0x00040000} \\ \text{Row17} & \text{0x00020000} \\ \text{Row16} & \text{0x00010000} \\ \text{Row15} & \text{0x00008000} \\ \text{Row14} & \text{0x00004000} \\ \text{Row13} & \text{0x00002000} \\ \text{Row12} & \text{0x01001001} \\ \text{Row11} & \text{0x00000900} \\ \text{Row10} & \text{0x00000400} \\ \text{Row9} & \text{0x00000200} \\ \text{Row8} & \text{0x00000100} \\ \text{Row7} & \text{0x00000080} \\ \text{Row6} & \text{0x00000040} \\ \text{Row5} & \text{0x00000020} \\ \text{Row4} & \text{0x00000010} \\ \text{Row3} & \text{0x00000008} \\ \text{Row2} & \text{0x0000000c} \\ \text{Row1} & \text{0x00000002} \\ \text{Row0} & \text{0x00000001} \end{Bmatrix} \begin{matrix} 1 \\ 1 \\ 1 \\ 1 \\ 1 \\ 1 \\ 1 \\ 1 \\ 1 \\ 1 \\ 1 \\ 1 \\ 1 \\ 1 \\ 1 \\ 1 \\ 1 \\ 1 \\ 1 \\ 3 \\ 2 \\ 1 \\ 1 \\ 1 \\ 1 \\ 1 \\ 1 \\ 1 \\ 1 \\ 2 \\ 1 \\ 1 \end{matrix}$$

Fig. 10

$$U_{tx\_08} = \begin{Bmatrix} \text{Row31} & \text{0x20800000} & 2 \\ \text{Row30} & \text{0x90400000} & 3 \\ \text{Row29} & \text{0xc8200000} & 4 \\ \text{Row28} & \text{0x64100000} & 4 \\ \text{Row27} & \text{0xb2080000} & 5 \\ \text{Row26} & \text{0x59040000} & 5 \\ \text{Row25} & \text{0x0c020000} & 3 \\ \text{Row24} & \text{0x86010000} & 4 \\ \text{Row23} & \text{0x03008000} & 3 \\ \text{Row22} & \text{0x21004000} & 3 \\ \text{Row21} & \text{0x00002000} & 1 \\ \text{Row20} & \text{0x00001100} & 2 \\ \text{Row19} & \text{0x88000900} & 4 \\ \text{Row18} & \text{0xc4000400} & 4 \\ \text{Row17} & \text{0x62000200} & 4 \\ \text{Row16} & \text{0x31000100} & 4 \\ \text{Row15} & \text{0x28000080} & 3 \\ \text{Row14} & \text{0x04200040} & 3 \\ \text{Row13} & \text{0x22200020} & 4 \\ \text{Row12} & \text{0x08100010} & 3 \\ \text{Row11} & \text{0x00000009} & 2 \\ \text{Row10} & \text{0x2c000004} & 4 \\ \text{Row9} & \text{0x36000002} & 5 \\ \text{Row8} & \text{0x1b000001} & 5 \\ \text{Row7} & \text{0x8c004000} & 4 \\ \text{Row6} & \text{0x92100000} & 4 \\ \text{Row5} & \text{0xa2040000} & 4 \\ \text{Row4} & \text{0x1c000000} & 3 \\ \text{Row3} & \text{0x8e000000} & 4 \\ \text{Row2} & \text{0x41010000} & 3 \\ \text{Row1} & \text{0xc3000000} & 4 \\ \text{Row0} & \text{0x41000000} & 2 \end{Bmatrix}$$

Fig. 11

$$S_{tx\_08} = S_{tx\_08}^{-1} = \begin{Bmatrix} \text{Row31} & \text{0x80000000} & 1 \\ \text{Row30} & \text{0x40000000} & 1 \\ \text{Row29} & \text{0x20000000} & 1 \\ \text{Row28} & \text{0x10000000} & 1 \\ \text{Row27} & \text{0x08000000} & 1 \\ \text{Row26} & \text{0x04000000} & 1 \\ \text{Row25} & \text{0x02000000} & 1 \\ \text{Row24} & \text{0x01000000} & 1 \\ \text{Row23} & \text{0x00800000} & 1 \\ \text{Row22} & \text{0x00400000} & 1 \\ \text{Row21} & \text{0x00200000} & 1 \\ \text{Row20} & \text{0x00100000} & 1 \\ \text{Row19} & \text{0x00080000} & 1 \\ \text{Row18} & \text{0x00040000} & 1 \\ \text{Row17} & \text{0x00020000} & 1 \\ \text{Row16} & \text{0x00010000} & 1 \\ \text{Row15} & \text{0x40008000} & 2 \\ \text{Row14} & \text{0x20004000} & 2 \\ \text{Row13} & \text{0x20002000} & 2 \\ \text{Row12} & \text{0x10001100} & 3 \\ \text{Row11} & \text{0x00000900} & 2 \\ \text{Row10} & \text{0x00000400} & 1 \\ \text{Row9} & \text{0x00000200} & 1 \\ \text{Row8} & \text{0x00000100} & 1 \\ \text{Row7} & \text{0x00400080} & 2 \\ \text{Row6} & \text{0x10000040} & 2 \\ \text{Row5} & \text{0x04000020} & 2 \\ \text{Row4} & \text{0x00000011} & 2 \\ \text{Row3} & \text{0x00000008} & 1 \\ \text{Row2} & \text{0x01000004} & 2 \\ \text{Row1} & \text{0x00000002} & 1 \\ \text{Row0} & \text{0x00000001} & 1 \end{Bmatrix}$$

Fig. 12

$$U_{rx\_08} = \begin{Bmatrix} \text{Row31} & 0x20800000 & 2 \\ \text{Row30} & 0x90400000 & 3 \\ \text{Row29} & 0xc8200000 & 4 \\ \text{Row28} & 0x64100000 & 4 \\ \text{Row27} & 0xb2080000 & 5 \\ \text{Row26} & 0x59040000 & 5 \\ \text{Row25} & 0x0c020000 & 3 \\ \text{Row24} & 0x86010000 & 4 \\ \text{Row23} & 0x03008000 & 3 \\ \text{Row22} & 0x21004000 & 3 \\ \text{Row21} & 0x00022000 & 2 \\ \text{Row20} & 0x00001040 & 2 \\ \text{Row19} & 0x88000900 & 4 \\ \text{Row18} & 0xc4000400 & 4 \\ \text{Row17} & 0x62000200 & 4 \\ \text{Row16} & 0x31000100 & 4 \\ \text{Row15} & 0x28000080 & 3 \\ \text{Row14} & 0x04200040 & 3 \\ \text{Row13} & 0x00200030 & 3 \\ \text{Row12} & 0x08500010 & 4 \\ \text{Row11} & 0x00000009 & 2 \\ \text{Row10} & 0x2c000004 & 4 \\ \text{Row9} & 0x36000002 & 5 \\ \text{Row8} & 0x1b000001 & 5 \\ \text{Row7} & 0x8c004000 & 4 \\ \text{Row6} & 0x92100000 & 4 \\ \text{Row5} & 0x00400002 & 2 \\ \text{Row4} & 0x04040000 & 2 \\ \text{Row3} & 0x8e000000 & 4 \\ \text{Row2} & 0x41010000 & 3 \\ \text{Row1} & 0xc3000000 & 4 \\ \text{Row0} & 0x41000000 & 2 \end{Bmatrix}$$

Fig. 14

$$S_{rx\_08} = \begin{pmatrix} \text{Row31} & \text{0x80000000} & 1 \\ \text{Row30} & \text{0x40000000} & 1 \\ \text{Row29} & \text{0x20000000} & 1 \\ \text{Row28} & \text{0x10000000} & 1 \\ \text{Row27} & \text{0x08000000} & 1 \\ \text{Row26} & \text{0x04000000} & 1 \\ \text{Row25} & \text{0x02000000} & 1 \\ \text{Row24} & \text{0x01000000} & 1 \\ \text{Row23} & \text{0x00800000} & 1 \\ \text{Row22} & \text{0x00400000} & 1 \\ \text{Row21} & \text{0x00200000} & 1 \\ \text{Row20} & \text{0x00100000} & 1 \\ \text{Row19} & \text{0x00080000} & 1 \\ \text{Row18} & \text{0x00040000} & 1 \\ \text{Row17} & \text{0x00020000} & 1 \\ \text{Row16} & \text{0x00010000} & 1 \\ \text{Row15} & \text{0x40008000} & 2 \\ \text{Row14} & \text{0x20004000} & 2 \\ \text{Row13} & \text{0x20022000} & 3 \\ \text{Row12} & \text{0x00001040} & 2 \\ \text{Row11} & \text{0x00000900} & 2 \\ \text{Row10} & \text{0x00000400} & 1 \\ \text{Row9} & \text{0x00000200} & 1 \\ \text{Row8} & \text{0x00000100} & 1 \\ \text{Row7} & \text{0x00400080} & 2 \\ \text{Row6} & \text{0x10000040} & 2 \\ \text{Row5} & \text{0x40000230} & 4 \\ \text{Row4} & \text{0x04000010} & 2 \\ \text{Row3} & \text{0x00000008} & 1 \\ \text{Row2} & \text{0x01000004} & 2 \\ \text{Row1} & \text{0x00000002} & 1 \\ \text{Row0} & \text{0x00000001} & 1 \end{pmatrix} \quad S_{rx\_08}^{-1} = \begin{pmatrix} \text{Row31} & \text{0x80000000} & 1 \\ \text{Row30} & \text{0x40000000} & 1 \\ \text{Row29} & \text{0x20000000} & 1 \\ \text{Row28} & \text{0x10000000} & 1 \\ \text{Row27} & \text{0x08000000} & 1 \\ \text{Row26} & \text{0x04000000} & 1 \\ \text{Row25} & \text{0x02000000} & 1 \\ \text{Row24} & \text{0x01000000} & 1 \\ \text{Row23} & \text{0x00800000} & 1 \\ \text{Row22} & \text{0x00400000} & 1 \\ \text{Row21} & \text{0x00200000} & 1 \\ \text{Row20} & \text{0x00100000} & 1 \\ \text{Row19} & \text{0x00080000} & 1 \\ \text{Row18} & \text{0x00040000} & 1 \\ \text{Row17} & \text{0x00020000} & 1 \\ \text{Row16} & \text{0x00010000} & 1 \\ \text{Row15} & \text{0x40008000} & 2 \\ \text{Row14} & \text{0x20004000} & 2 \\ \text{Row13} & \text{0x20022000} & 3 \\ \text{Row12} & \text{0x10001040} & 3 \\ \text{Row11} & \text{0x00000900} & 2 \\ \text{Row10} & \text{0x00000400} & 1 \\ \text{Row9} & \text{0x00000200} & 1 \\ \text{Row8} & \text{0x00000100} & 1 \\ \text{Row7} & \text{0x00400080} & 2 \\ \text{Row6} & \text{0x10000040} & 2 \\ \text{Row5} & \text{0x44000230} & 5 \\ \text{Row4} & \text{0x04000010} & 2 \\ \text{Row3} & \text{0x00000008} & 1 \\ \text{Row2} & \text{0x01000004} & 2 \\ \text{Row1} & \text{0x00000002} & 1 \\ \text{Row0} & \text{0x00000001} & 1 \end{pmatrix}$$

Fig. 15

HIGH PERFORMANCE CRC CALCULATION METHOD AND SYSTEM WITH A MATRIX TRANSFORMATION STRATEGY

FIELD OF THE INVENTION

The present invention relates generally to a CRC calculation, and, more particularly, to a high performance CRC calculation method and system with a matrix transformation strategy.

BACKGROUND OF THE INVENTION

Cyclic redundancy code (CRC) has been used for a long time to preserve the integrity of digital data in storage and transmission systems. More particularly, CRC is an important error detection tool used for communications and data processing applications. The CRC schemes are often used for checking integrity of data because they are easy to implement and they detect a large class of errors. CRC is a kind of checksum which is transmitted with data between a source node and a target node over a communications medium. The source node calculates the CRC for the data to be transferred using a predetermined polynomial and then transmits the data along with the CRC to the target node where the CRC of the received data is independently generated using the predetermined generator polynomial and compared with the CRC received from the source node to check if errors have occurred during the transmission. Treating the data or message as a binary polynomial, its CRC corresponding to a particular generator polynomial may be generated by raising the message polynomial to a proper power first and then taking the remainder of the message polynomial divided by the generator polynomial. For CRC generation, data bits are typically serially inputted into a CRC generator in order to produce the appropriate CRC code for transmission along with the data. Traditionally, CRC codes are generated with Linear Feedback Shift Register (LFSR) circuits. An LFSR takes the input data and shifts through a series of flip-flops on successive clock cycles. Combinations of the shift register output and data input are fed back to the flip-flops via exclusive-OR gates. An LFSR can be defined in terms of a generator polynomial which relates the input data and the CRC code via a polynomial expression and of which "+" is an exclusive-OR operation. The state of the flip-flops upon completion of the shifting process is the CRC code.

For example, ATM uses a FCS field derived from CRC error detection codes for error checking. The integrity of the transmitted or processed message in an ATM system is ensured by the addition at the end of the message of the FCS traveling with the message itself so it can be checked on the reception side for proper transmission. The FCS code has been standardized for data integrity checking as described in the ANSI X3.139-1987 document pages 28 and 29. All the CRC codes constitute a finite Galois Field (GF), and the CRC32 codes belong to the GF generated by the following generator polynomial of degree 32:

$$g(x) = x^{32} + x^{26} + x^{23} + x^{22} + x^{16} +$$
$$x^{12} + x^{11} + x^{10} + x^8 + x^7 + x^5 + x^4 + x^2 + x + 1.$$

This generator polynomial of degree 32 was chosen as a standard for error checking in Ethernet and then chosen by the ATM standard for AAL5 error checking. In the circuitry for calculating the FCS or checking the message, an LFSR carries out a bit by bit multiplication in the GF, i.e., modulo the polynomial on which GF is generated, and by which each bit of the message is inputted into the LFSR in the manner of most significant bit (MSB) first and division is performed by feedbacks. At the end of the process, the FCS, i.e., the remainder of the division, is within the shift registers.

Hardware implementation for CRC generators in large scale digital systems is preferred because it is faster. The drawback of hardware implementation of CRCs is that more hardware is required with consequent increase in cost, size and complexity and a decrease in reliability. Software implemented CRCs are known although their use is not widespread because of the speed penalty thought to be inevitable. Those skilled in the art understand that choosing a polynomial of a larger degree will result in greater error detection. However, for the applications of current large scale systems, the desired hardware becomes too complicated and costly to be implemented and the required software needs huge computations. Several improvements were made for CRC generators. For example, by using CRC routines to generate tables consisting of all possible combinations of the chosen polynomial, the checksum generation is reduced to a table lookup. These CRC routines are considered to be the fastest software implementations available, but they take up a great deal of dedicated memory. Early CRC implementations use the concept of LFSR in which the polynomial division is processed one bit at a time. However, the serial processing for the generation of the CRC is relatively slow, and as the technology advanced, single-bit CRC generation was not enough to handle high-speed data processing and transmission, and parallel CRC algorithms were then developed to meet this need. The key reason that existing CRC algorithms are limited in their degree of parallelism is deeply rooted in the concept of LFSRs. All existing algorithms try to solve the same problem, i.e., how to parallelize the bit-by-bit operation of LFSRs. As a result, the degree of parallelism never goes beyond the perceived size of LFSRs.

Accordingly, it is desired a CRC calculation method and system to reduce the processing for generation of CRC codes.

SUMMARY OF THE INVENTION

The present invention is directed to a methodology to simplify the CRC calculation, by which the process for the CRC generation is speeded up and the circuitry for the system is simplified.

In a method and system to simplify the CRC calculation, according to the present invention, a linear mapping matrix is used for the operation of the LFSR to generate the CRC and the maximum value of the non-zero entries in the mapping matrix is reduced by applying one or more raw operations to the linear mapping matrix in advance before the computation of mapping the input message to a CRC result for the CRC generation. Various transformation matrixes are provided for the reduction of the maximum value of the non-zero entries in the mapping matrix. In addition, the input messages are padded with specific dummies on the transmission side or the CRC outputs on the reception side are compared with specific patterns in accordance with their length types for the doubleword-wise CRC32 case.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIG. 2 shows two schemes linearly mapped from those of FIG. 1;

FIG. 3 shows the mapping matrix and its inverse for CRC32 generations;

FIG. 4 shows the circuitries for byte-wise CRC32 generations;

FIG. 5 shows the mapping matrix and its inverse for byte-wise CRC32 generations;

FIG. 9 shows an excellent solution of the matrix U for doubleword-wise CRC32;

FIG. 10 shows an excellent solution of the matrix S corresponding to the matrix U of FIG. 9;

FIG. 11 shows an excellent solution of the matrix U for the transmission byte-wise CRC32 generator;

FIG. 12 shows an excellent solution of the matrix S corresponding to the matrix U of FIG. 11;

FIG. 14 shows an excellent solution of the matrix U for the reception byte-wise CRC32 checker;

FIG. 15 shows an excellent solution of the matrix S corresponding to the matrix U of FIG. 14.

DETAILED DESCRIPTION OF THE INVENTION

Cyclic Code in a Systematic Form

As is well-known, an (n, k) linear code C is called a cyclic code if every cyclic shift of a code vector in C is also a code vector in C. To figure out a cyclic code in a systematic form on the transmission side, let the message to be encoded is $$M=(m_{k-1} \ldots m_1 m_0)^T, \quad \text{(EQ-1)}$$

and the corresponding message polynomial is $$m(x)=m_0 x^{k-1}+m_1 x^{k-2}+ \ldots +m_{k-2}x+m_{k-1}. \quad \text{(EQ-2)}$$

After multiplying $m(x)$ by $x^{n-k}$, equation EQ-2 becomes $$x^{n-k}m(x)=m_0 x^{n-1}+m_1 x^{n-2}+ \ldots +m_{k-2}x^{n-k+1}+m_{k-1}x^{n-k}. \quad \text{(EQ-3)}$$

Then, $x^{n-k}m(x)$ is divided by the generator polynomial $g(x)$, and it becomes $$x^{n-k}m(x)=q(x)g(x)+r(x). \quad \text{(EQ-4)}$$

By rearranging equation EQ-4 and inversing the sign of the remainder to replace the original one, it will be obtained the codeword polynomial $$x^{n-k}m(x)+r(x)=q(x)g(x). \quad \text{(EQ-5)}$$

Obviously, this codeword polynomial is divisible by the generator polynomial $g(x)$.

From the above description, it can be summarized that a cyclic encoding in a systematic form includes:

Step 1. Multiplying the message $m(x)$ by $x^{n-k}$;

Step 2. Deriving the remainder $r(x)$ by dividing $x^{n-k}m(x)$ by the generator polynomial $g(x)$; and Step 3. Combining $r(x)$ with $x^{n-k}m(x)$ to obtain the codeword polynomial $x^{n-k}m(x)+r(x)$.

Likewise, in order to check the integrity of the received codeword on the reception side, it is verified if the received sequence is divisible by the generator polynomial $g(x)$.

Shortened Cyclic Codes

Given an (n, k) cyclic code C, if the set of the code vectors for which the l leading high-order information digits are identical to zero, then there are $2^{k-l}$ such code vectors and they form a linear subcode of C. If the l zero information digits are deleted, it is obtained a set of $2^{k-l}$ vectors of length n–l. These shortened vectors form an (n–l, k–l) linear code, and which code is called a shortened cyclic code and is not cyclic.

Implementation of Divisor

No matter for a cyclic code encoding or decoding, a divisor of Galois Field GF(2) is needed. For example, a simple Linear Feedback Shift Register (LFSR) is employed to implement the divisor. Furthermore, depending on the dividend sequence shifted into LFSR either from MSB side or Least Significant Bit (LSB) side, there are two schemes for implementation of a divisor, i.e., Scheme 1: Message is shifted into LFSR from MSB side, which is mathematically equivalent to $$m(x)x^{n-k} \bmod g(x) \quad \text{(EQ-6)}$$

Scheme 2: Message is shifted into LFSR from LSB side, which is mathematically equivalent to $$m(x) \bmod g(x) \quad \text{(EQ-7)}$$

Figure 1:
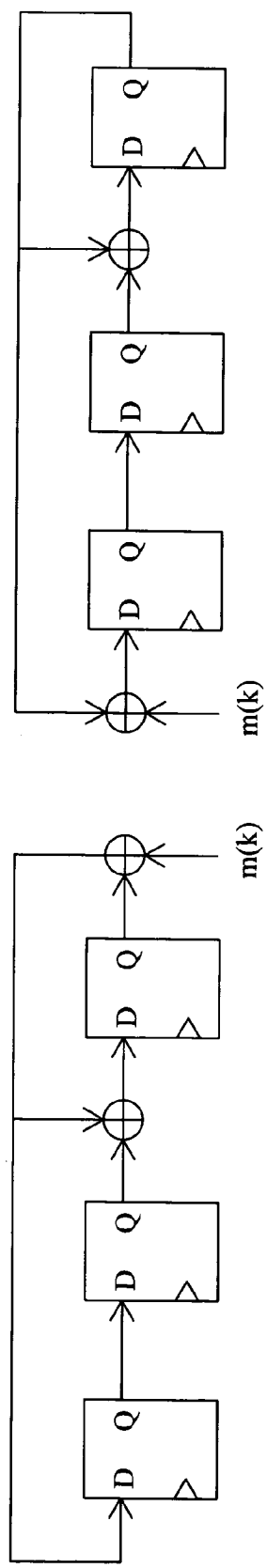
FIG. 1 shows two schemes for a generator polynomial with message shifted into LFSR from MSB and LSB sides, respectively.

For illustration, two circuitries are shown in FIG. 1 for these two schemes for the generator polynomial $g(x)=x^3+x^2+1$.

Linear Mapping

Further, the linear feedback shift registers shown in FIG. 1 can be regarded as a linear mapping mathematically, as shown in FIG. 2. For the same generator polynomial $g(x)=x^3+x^2+1$, it can be derived the G mapping:

$$g_0(2)=g_i(2) \oplus g_i(1), \quad \text{(EQ-8a)}$$

$$g_0(1)=g_i(0), \text{ and} \quad \text{(EQ-8b)}$$

$$g_0(0)=g_i(2), \quad \text{(EQ-8c)}$$

and this linear mapping can be represented in a matrix form as $$\begin{bmatrix} g_0(2) \\ g_0(1) \\ g_0(0) \end{bmatrix} = G \begin{bmatrix} g_i(2) \\ g_i(1) \\ g_i(0) \end{bmatrix} \quad \text{(EQ-9)}$$

where $$G = \begin{bmatrix} 0 & 1 & 0 \\ 1 & 0 & 1 \\ 1 & 0 & 0 \end{bmatrix} \quad \text{(EQ-10)}$$

and trivially, the matrix G is invertible and its inverse matrix is $$G^{-1} = \begin{bmatrix} 0 & 0 & 1 \\ 1 & 0 & 0 \\ 0 & 1 & 1 \end{bmatrix} \quad \text{(EQ-11)}$$

Based on the Scheme 1 and 2, there exist recursive equations between the output of the D-type flip-flops of the polynomial generator g(x) and the input of the encoded message, respectively, as Scheme 1:

$$R(k) = G(R(k-1) + M(k-1)), \text{ and} \quad \text{(EQ-12)}$$

Scheme 2:

$$R(k) = GR(k-1) + M(k-1). \quad \text{(EQ-13)}$$

Further tracing the output of the D-type flip-flops, i.e., the remainder of a division, in Scheme 1, it results in $$R(0) = I, \quad \text{(EQ-14a)}$$

$$R(1) = G(R(0) + M(0)) = GI + GM, \quad \text{(EQ-14b)}$$

$$R(2) = G(R(1) + M(1)) \quad \text{(EQ-14c)}$$
$$= G^2 I + G^2 M(0) + GM(1),$$

...

$$R(k) = G(R(k-1) + M(k-1)) \quad \text{(EQ-14d)}$$
$$= G^k I + G^k M(0) + G^{k-1} M(1) + \ldots + GM(k-1)$$

Generation of FCS

In Standard 802.3, the CRC32 is employed to generate FCS and the generator polynomial is $$g(x) = x^{32} + x^{26} + x^{23} + x^{22} + x^{16} + x^{12} + x^{11} + x^{10} + x^8 + x^7 + x^5 + x^4 + x^2 + 1. \quad \text{(EQ-15)}$$

Mathematically, the CRC value corresponding to a given frame is defined by the following procedures:
a.) The first 32 bits of the frame are complemented;
b.) The k bits of the frame are then considered to be the coefficients of a polynomial m(x) of degree k−1;
c.) m(x) is multiplied by $X^{32}$ and divided by g(x), producing a remainder r(x) of degree less than or equal to 31;
d.) The coefficients of r(x) are considered to be a 32-bit sequence; and
e.) The bit sequence is complemented and the result is the FCS f(x).

In the procedure a, disclosed are two implementation methods:
Method 1: complementing the first 32 bits of the message directly; and Method 2: initiating the D-type flip-flop with 1 specific value, e.g., 0xffffffff for the Scheme 1 and 0x46af6449 for the Scheme 2.

The mapping matrix G and its inverse matrix $G^{-1}$ are shown in FIG. 3.

On the reception side, when the whole of frame is acquired, the output of the Scheme 1 CRC checker is compared with the value of 0xc704dd7b to examine the integrity of the received frame. The reason is explained herewith.

Let the transmitted message (except for FCS) is represented in a polynomial form $$m(x) = m_0 x^{k-1} + m_1 x^{k-2} + \ldots + m_{k-2} x + m_{k-1}, \quad \text{(EQ-16)}$$

and defining a polynomial c(x) of degree 31 with all of its coefficients to be $$c(x) = 1x^{31} + 1x^{30} + \ldots + 1x^2 + 1x + 1, \quad \text{(EQ-17)}$$

then the remainder r(x) generated by the procedure c will be $$r(x) = (m(x) + c(x)x^{k-32})x^{32} \bmod g(x). \quad \text{(EQ-18)}$$

After performing procedures d to e, it will generate FCS and the transmitted sequences $$f(x) = \overline{r(x)}, \text{ and} \quad \text{(EQ-19)}$$

$$n(x) = m(x)x^{32} + f(x) \quad \text{(EQ-20)}$$

On the reception side, if the integrity of this frame sequence is maintained, then the remainder of a division will be $$s(x) = (n(x) + c(x)x^k)x^{32} \bmod g(x) \quad \text{(EQ-21)}$$
$$= (m(x)x^{32} + f(x) + c(x)x^k)x^{32} \bmod g(x)$$
$$= (m(x)x^{32} + c(x)x^k + f(x))x^{32} \bmod g(x)$$

From equation EQ-18, equation EQ-21 can be further modified to be $$s(x) = (q(x)g(x) + r(x) + f(x))x^{32} \bmod g(x) \quad \text{(EQ-22)}$$
$$= (r(x) + f(x))x^{32} \bmod g(x)$$
$$= c(x)x^{32} \bmod g(x)$$
$$= [0xc704dd7b][x^{31} \ldots x^1 1]$$

Based on a similar derivation, it can be further obtained, if the Scheme 2 is adopted, that the checking pattern will be the value of 0xffffffff.

Parallelized CRC Calculation

So far the encoding message is sequentially inputted to the CRC calculation with one bit each time, however, for high-speed applications, CRC calculation is desired for the capability of multiple message bits inputted, e.g., byte-wise, at a time to increase the throughput. Consequently, the principal architecture of the previous proposed two schemes is maintained and there is only somewhat difference at the mapping matrix.

Let the input message and the status of the flip-flops be represented, respectively, with a vector form as $$M(k) = [m_k \ 0 \ \ldots \ 0]^T, \text{ and} \quad \text{(EQ-23)}$$

$$R(k)=[r_k^{31}\ r_k^{30}\ \ldots\ r_k^0]^T. \quad \text{(EQ-24)}$$

Tracing the R(k) influenced by the values of M(k), initially, R(0)=0, (EQ-25a)

then, $R(1)=G(R(0)+M(0))=GM(0)$, and (EQ-25b)

$R(2)=G(R(1)+M(1))=G^2M(0)+GM(1)$. (EQ-25c)

It can be further verified $G^2M(0)=m_0 \times$ the 1st column of the $G^2$ matrix, and (EQ-26a)

$GM(1)=m_1 \times$ the 1st column of the $G$ matrix. (EQ-26b)

Defining a new vector with $l(\leq 32)$ non-zero entries as $$M_l(k) = [m_k^{l-1} m_k^{l-2} \ldots m_k^0 0 \ldots 0]^T \quad \text{(EQ-27a)}$$

$$= [m_{k*1} m_{k*1+1} \ldots m_{k*1+1} 0 \ldots 0]^T \quad \text{(EQ-27b)}$$

When l=2 and k=0, it becomes $$M_2(0)=[m_0\ m_1\ \ldots\ 0\ \ldots\ 0]^T, \quad \text{(EQ-28)}$$

and it is further derived $G^2M_2(0)=m_0 \times$ the 1st column of the $G^2$ matrix $+m_1 \times$ the 2nd column of the $G^2$ matrix. (EQ-29)

Examining the property of the G matrix, it can be found the 1st column of the G matrix=the 2nd column of the $G^2$ matrix. (EQ-30)

Hence, it is obtained $G^2M_2(0)=G^2M(0)+GM(1)$, (EQ-31)

and it is further included that $G^lM_l(0)=G^lM(0)+G^{l-1}M(1)+\ldots+GM(l-1)$, for $l \leq 32$. (EQ-32)

When the message is inputted in byte-wise form at a time, the input message and calculated remainder vectors are represented as $$M_8(k)=[m_k^7\ m_k^6\ \ldots\ m_k^0\ 0\ \ldots\ 0]_{1 \times 32}^T \quad \text{(EQ-33)}$$

$$R(k)=[r_k^{31}\ r_k^{30}\ \ldots\ r_k^0]_{1 \times 32}^T \quad \text{(EQ-34)}$$

If the Scheme 1 is adopted, the recursive equation of the input message and calculated remainder is $R(k+1)=T(R(k)+M_8(k))$, (EQ-35)

and the circuitry is shown in FIG. 4.

Likewise, if the Scheme 2 is adopted, the recursive equation will be $R(k+1)=TR(k)+M_8(k)$, (EQ-36)

and its circuitry is also shown in FIG. 4.

For equation EQ-35 and 36, the mapping matrix T and its inverse are shown in FIG. 5, and of which, the number on the right-hand side of each row indicates how many nonzero entries that row has. For example, in the matrix T, Row 1 has 4 nonzero entries and those rows with maximum nonzero entries, the value of 7, are Row 5, 12 and 13. In the T matrix of FIG. 5, for a specific row, the number of nonzero entries subtracting one is equivalent to how many GF(2) adder (modulo 2) needed. If the maximum value of the non-zero entries in the T matrix is reduced, the operation speed of the CRC circuitry could be promoted further, due to the dramatic reduction of computations in the matrix multiplication or iteration procedure.

Similarity of Matrices

If there are two matrices T and U with the relationship $U=STS^{-1}$, (EQ-37)

where S is invertible, then the matrix U is similar to the matrix T. Based on the similarity of matrices, there can be obtained two properties a) $T^k=S^{-1}U^kS$, and b) U is invertible if T is invertible.

Substitution of the properties into equation EQ-12 and replacement of G with T will result in $R(k)=S^{-1}US(R(k-1)+M(k-1))$, (EQ-38a)

$SR(k)=U(SR(k-1)+SM(k-1))$. (EQ-38b)

Let $\hat{R}(k)=SR(k)$, and (EQ-39a)

$\hat{M}(k)=SM(k)$, (EQ-39b)

then $\hat{R}(k)=U(\hat{R}(k-1)+\hat{M}(k-1))$. (EQ-40)

Figure 6:
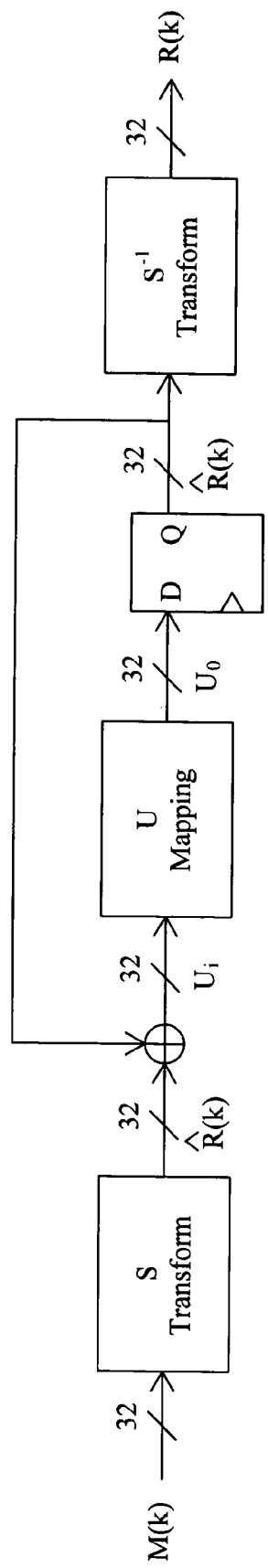
FIG. 6 shows a circuitry corresponding to a CRC calculation with a matrix transformation applied to the Scheme 1 of FIG. 4.

The circuitry corresponding to equation EQ-40 is shown in FIG. 6.

Figure 7:
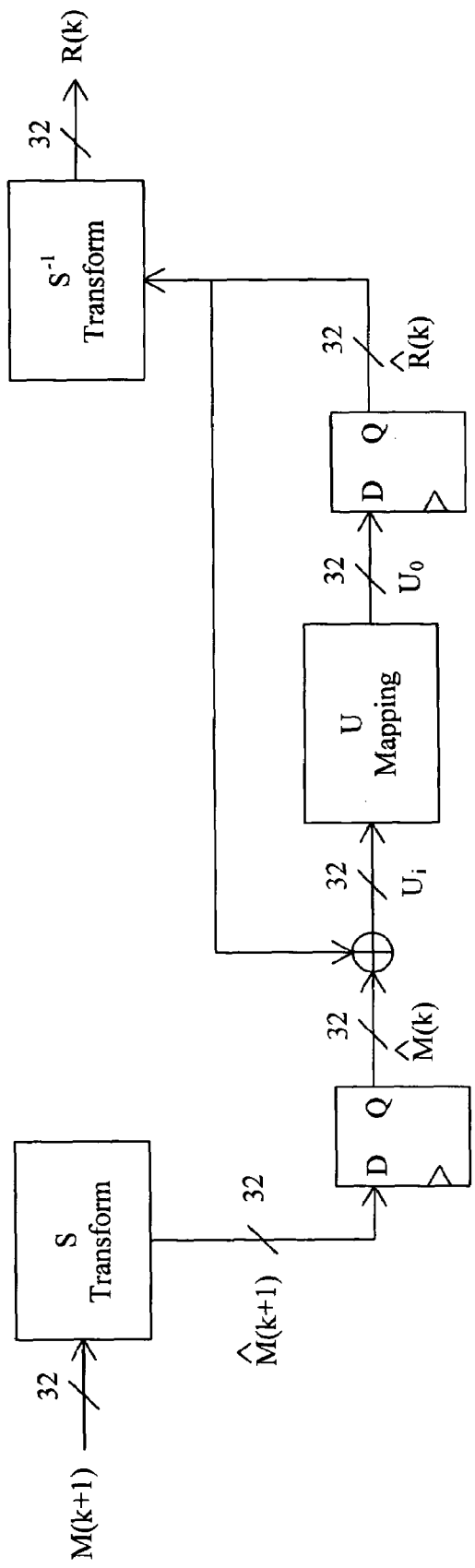
FIG. 7 shows a CRC generator with a pipeline architecture by additionally inserting a 32-bit-wise flip-flops at the output of the S transform of the circuitry shown in FIG. 6.

Further, without effecting the mathematical equality, a 32-bit-wise flip-flops is additionally inserted at the output of the S transform of the circuitry shown in FIG. 6, in order to form a pipeline architecture as shown in FIG. 7.

Figure 8:
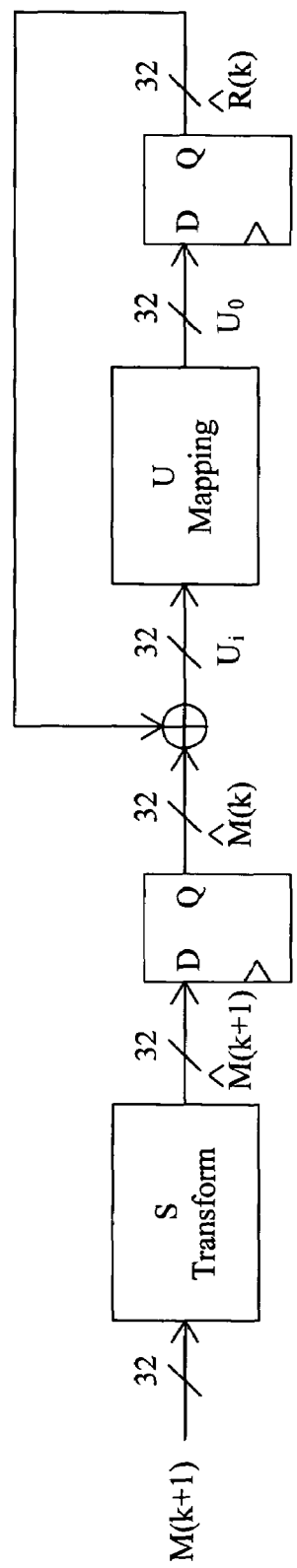
FIG. 8 shows a CRC checker with a pipeline architecture corresponding to the circuitry shown in FIG. 7.

On the other hand, if the CRC calculation is applied on the reception side, an alternative method is proposed to omit the practical hardware operation of $S^{-1}R(i)$ for the comparison with $P_i$, i.e., to compare the output of the flip-flops thereof with the value of $SP_i$, which can be carried out in advance. The resultant circuitry is shown in FIG. 8.

For convenience, let $\Psi(T)$ represent the maximum value of non-zero entries among all rows of the matrix T. To analyze the circuitry of FIG. 7, if both $\Psi(U)$ and $\Psi(S)$ are less than $\Psi(T)$, an advantage will be acquired that the CRC calculation can operate in a higher clocking. To find such matrices U and S, one strategy is proposed that the matrix S is produced by the multiplication of some basic row operation matrices $R_{(i,j)}$, whose function is to add Row i with Row j to thereby produce a new Row j. For a 3×3 matrix T, for example, to generate another matrix U whose Row 0 and 1 are the same as those of the matrix T and whose Row 2 is the summation of Row 0 and 2 of the matrix T, the matrix U can be acquired by multiplying the matrix T in the left side by a row operation matrix $$R_{(0,2)} = \begin{bmatrix} 1 & 0 & 0 \\ 0 & 1 & 0 \\ 1 & 0 & 1 \end{bmatrix}. \quad \text{(EQ-41)}$$

Moreover, the invertible matrix of $R_{(0,2)}$ will be itself, i.e., $$R_{(0,2)}{}^*R_{(0,2)} = \begin{bmatrix} 1 & 0 & 0 \\ 0 & 1 & 0 \\ 0 & 0 & 1 \end{bmatrix} = I, \text{ and} \quad \text{(EQ-42)}$$

thus $$R_{(0,2)}{}^{-1} = R_{(0,2)}. \quad \text{(EQ-43)}$$

Searching Algorithm for S and U Matrices
Step 1: Let $S(0)=I$, $S^{-1}(0)=I$, $U(0)=T$ and $k=0$.
Step 2: If there exists a row operation matrix $R_{(i,j)}$ so that both $\Psi(R(i,j)U(k)R(i,j)) < \Psi(U(k))$ and $\Psi(R(i,j)S(k)) \leq \Psi(T)$, then go to Step 3, else go to Step 4.
Step 3: $S(k+1)=R(i,j)S(k)$, $S^{-1}(k+1)=S^{-1}(k)R(i,j)$, $U(k+1)=R(i,j)U(k)R(i,j)$, and $k=k+1$, then go to Step 2.
Step 4: Let $S=S(k)$, $S^{-1}=S^{-1}(k)$, and $U=U(k)$, then $STS^{-1}=U$, $\Psi(U) < \Psi(T)$, and $\Psi(S) \leq \Psi(T)$.

Doubleword-wise CRC 32
After searching by running the program to implement the above steps, there are total 242 solutions of S and U matrices satisfied the criteria in the case of doubleword-wise CRC32, among them an excellent solution is shown in FIGS. 9 and 10.

Other than the case of the message inputted in byte-wise form, however, the MAC frame is based on octet format, and the length of the processed message is not always divisible by 4. As a result, some dummies are padded on the message in order to have the doubleword-wise format when the doubleword-wise CRC calculation is employed. Two strategies for dummy padding are further proposed:

Strategy 1: padding with some zero-valued octets before the prefix of the processed message for the transmission side; and
Strategy 2: padding with some zero-valued octets after the suffix of the processed message for the reception side.

When the message is inputted in doubleword-wise form at a time, the input message and calculated remainder vectors are $$M_{32}(k)=[m_k{}^{31}\ m_k{}^{30}\ \ldots\ m_k{}^0]_{1\times 32}{}^T, \text{ and} \quad \text{(EQ-44a)}$$

$$R(k)=[r_k{}^{31}\ r_k{}^{30}\ \ldots\ r_k{}^0]_{1\times 32}{}^T. \quad \text{(EQ-44b)}$$

Similar to the byte-wise case, the recursive equation R(k) for the Scheme 1 and 2 are $$R(k+1)=T(R(k)+M_{32}(k)), \text{ and} \quad \text{(EQ-45a)}$$

$$R(k+1)=T\,R(k)+M_{32}(k). \quad \text{(EQ-45b)}$$

In the doubleword-wise case, no matter what the length of a frame is, they can be classified in accordance with their length into four types: $4n$, $4n+1$, $4n+2$ and $4n+3$. If the Strategy 1 is adopted, the initial values of the flip-flops will vary with the length type as listed in

TABLE 1

| Length type | Padding number | C(0) | C(1) |
|---|---|---|---|
| 4n + 3 | 1 | 00 ff ff ff | ff 00 00 00 |
| 4n + 2 | 2 | 00 00 ff ff | ff ff 00 00 |
| 4n + 1 | 3 | 00 00 00 ff | ff ff ff 00 |
| 4n | 4 | 00 00 00 00 | ff ff ff ff |

The recursive equations are $$R(1)=TC(0), \text{ and} \quad \text{(EQ-46a)}$$

$$R(2)=T(R(1)+C(1))=T^2C(0)+TC(1) \quad \text{(EQ-46b)}$$

Let the initial values of the flip-flops be R(0), so that $$T^2R(0)=T^2C(0)+TC(1), \text{ or} \quad \text{(EQ-47a)}$$

$$R(0)=C(0)+T^{-1}C(1), \quad \text{(EQ-47b)}$$

and R(0) is listed in

TABLE 2

| Length type | The initial value of R(0) |
|---|---|
| 4n + 3 | 0x9bf1a90f |
| 4n + 2 | 0x09b93859 |
| 4n + 1 | 0x816474c5 |
| 4n | 0x46af6449 |

In the strategy 2, the resultant output of the flip-flops will vary with the length of the processed frame, which result implies, for examining the integrity of a received frame, the output Pi is compared with a specified pattern depending on the length type i, in the following rule $$Pi=G^{8i}[0xc704dd7b]^T, \text{ for } i=1, 2, 3 \text{ and } 4, \quad \text{(EQ-48)}$$

and the pattern in

TABLE 3

| Length type | Padding number | Pattern (Pi) |
|---|---|---|
| 4n + 3 | 1 | 0x4710bb9c |
| 4n + 2 | 2 | 0x3a7abc72 |
| 4n + 1 | 3 | 0x8104c946 |
| 4n | 4 | 0x69044bb59 |

If the method 1 is adopted, from Table 2 and the relationship of $\hat{R}(k)=SR(k)$, it is obtained the initial value of the flip-flops in this transform-type CRC calculation as

TABLE 4

| Length type | Initial value of R(0) |
|---|---|
| 4n + 3 | 0x9bf1a10b |
| 4n + 2 | 0x09b9385d |
| 4n + 1 | 0x816474c5 |
| 4n | 0x46af744d |

Likewise, if the method 2 is adopted, the checking pattern, based on the transformation and Table 3, will be

TABLE 5

| Length type | Padding member | Pattern |
|---|---|---|
| 4n + 3 | 1 | 0x4710a398 |
| 4n + 2 | 2 | 0x3a7abc72 |
| 4n + 1 | 3 | 0x8104d146 |
| 4n | 4 | 0x6904b35d |

The comparison of normal and transform-type CRC calculations is summarized in

TABLE 6

|  | $\Psi(T)/\Psi(U)$ | $\Psi(S)$ | 2XOR needed in T/U | 2XOR needed in S | 2XOR needed in $S^{-1}$ |
|---|---|---|---|---|---|
| Normal | 17 | NA | 420 | NA | NA |
| Transform | 15 | 3 | 394 | 4 | 4 |

Byte-wise CRC32

Figure 13:
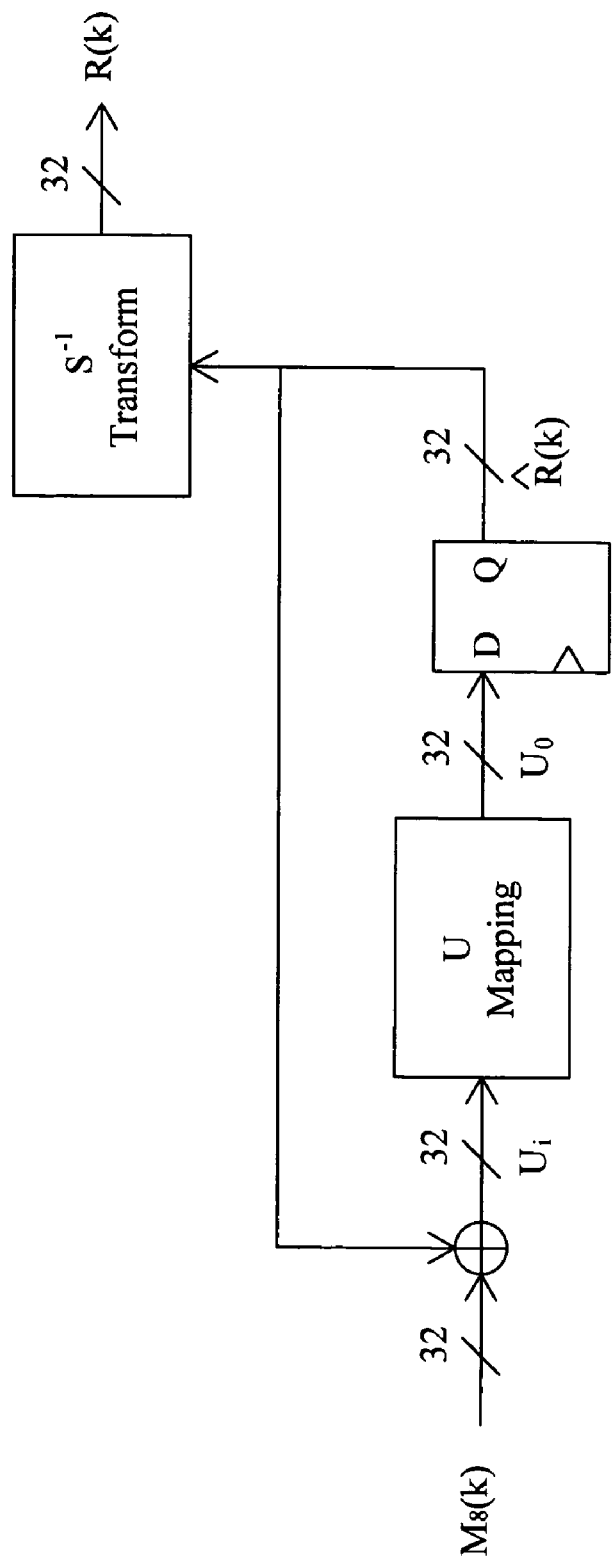
FIG. 13 shows a circuitry for the transmission byte-wise CRC32 generator corresponding to the matrices U and S of FIGS. 11 and 12.
Figure 16:
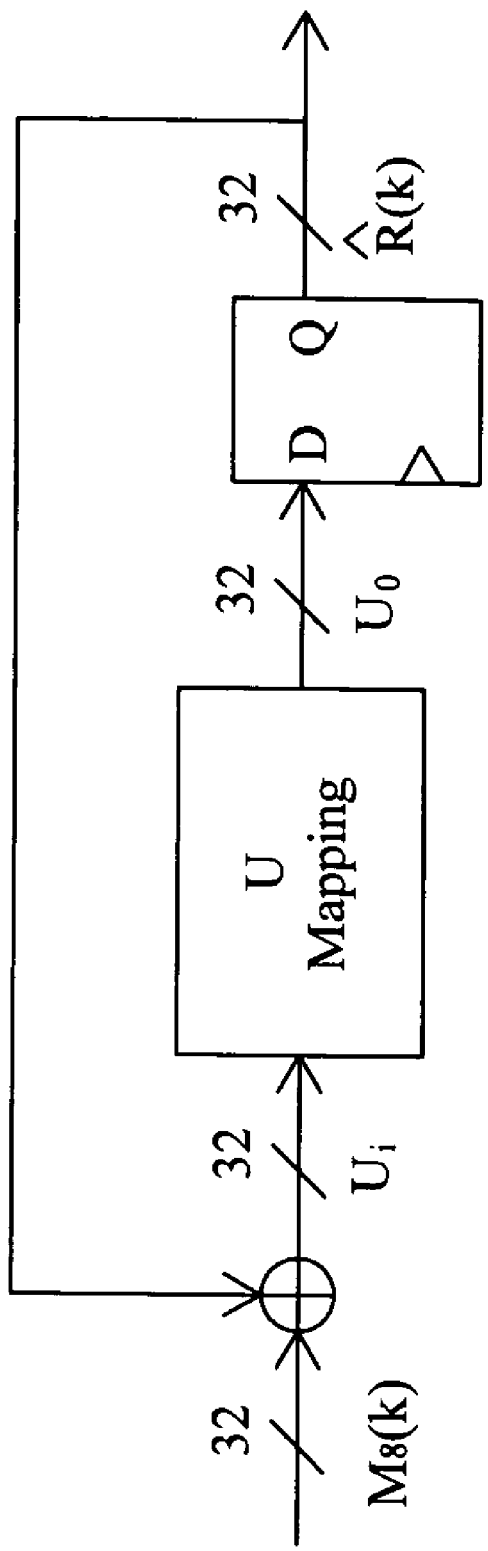
FIG. 16 shows a circuitry for the reception byte-wise CRC32 checker corresponding to the matrices U and S of FIGS. 14 and 15.

After searching by running the program, there are more than 10 million solutions of S and U matrices satisfied the criteria in the case of byte-wise CRC32, among them two excellent solutions are provided, one for the transmission side and the other for the reception side. For the excellent solution of the transmission CRC generator, FIGS. 11 and 12 show the matrices $U_{tx\text{-}08}$ and $S_{tx\text{-}08}$, and FIG. 13 depicts the corresponding circuitry. For the excellent solution of the reception CRC checker, FIGS. 14 and 15 show the matrices $U_{rx\text{-}08}$ and $S_{rx\text{-}08}$, and FIG. 16 depicts the corresponding circuitry.

From equation EQ-40, the initial value of the flip-flops can be calculated out. Let $$\hat{R}(4) = (U^4 + U^3 + U^2 + U)\hat{M}(0). \quad \text{(EQ-49)}$$

Assume $$\hat{R}(4) = U^4 \hat{R}(0), \quad \text{(EQ-50)}$$

then $$\hat{R}(0) = (I + U^{-1} + U^{-2} + U^{-3})\hat{M}(0). \quad \text{(EQ-51)}$$

The comparison of normal and transform-type CRC calculations is summarized in

TABLE 7

|  | $\Psi(T)/\Psi(U)$ | $\Psi(S)$ | 2XOR needed in T/U | 2XOR needed in S | 2XOR needed in $S^{-1}$ |
|---|---|---|---|---|---|
| Normal | 7 | NA | 106 | NA | NA |
| Tx Transform | 5 | 3 | 80 | 0 | 11 |
| Rx Transform | 5 | 4 | 78 | 0 | 0 |

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A CRC calculation method for a message, comprising the steps of:
   defining a generator matrix having a maximum value of the non-zero entries for representing an LFSR corresponding to a form for linearly mapping an input vector to a remainder vector;
   transforming the generator matrix to a similar matrix for reducing the maximum value of the non-zero entries;
   arranging the message inputted in the form to the input vector; and
   transforming the message to a CRC result by multiplying the similar matrix to the input vector.

2. A method according to claim 1, wherein the form is a byte-wise form.

3. A method according to claim 1, wherein the form is a doubleword-wise form.

4. A method according to claim 3, wherein the step of arranging the message to the input vector comprises padding the message with one or more dummies.

5. A method according to claim 3, further comprising initiating the LFSR with a specific value.

6. A method according to claim 5, further comprising identify a length type of the message and determining the specific value in accordance with the length type.

7. A method according to claim 3, further comprising comparing the CRC result with a specific pattern.

8. A method according to claim 7, further comprising identify a length type of the message and determining the specific pattern in accordance with the length type.

9. A method according to claim 1, wherein the step of transforming the message to a CRC result comprises performing an iteration procedure between the remainder vector and the input vector.

10. A method according to claim 1, wherein the step of transforming the generator matrix to a similar matrix comprises the steps of:
    selecting an invertible matrix;
    generating an inverse matrix of the invertible matrix; and
    multiplying the invertible matrix, generator matrix and inverse matrix.

11. A method according to claim 10, further comprising inserting a flip-flop procedure between the multiplying of the invertible matrix and generator matrix for forming a pipeline architecture.

12. A CRC calculation system for generating a CRC result from a message, comprising:
    means for arranging the message inputted in a form to an input vector;
    a generator matrix having a maximum value of the non-zero entries for representing an LFSR corresponding to the form for linearly mapping the input vector to a remainder vector; and
    means for transforming the generator matrix to a similar matrix for reducing the maximum value of the non-zero entries; and
    means for multiplying the similar matrix to the input vector.

13. A system according to claim 12, wherein the form is a byte-wise form.

14. A system according to claim 12, wherein the form is a doubleword-wise form.

15. A system according to claim 14, further comprising one or more dummies for padding the message thereto.

16. A system according to claim 14, further comprising a specific value for initiating the LFSR therewith.

17. A system according to claim 16, further comprising means for identifying a length type of the message and determining the specific value in accordance with the length type.

18. A system according to claim 14, further comprising means for comparing the CRC result with a specific pattern.

19. A system according to claim 18, further comprising means for identifying a length type of the message and determining the specific pattern in accordance with the length type.

20. A system according to claim 12, wherein the means for transforming the generator matrix to a similar matrix comprises means for multiplying the generator matrix to an invertible matrix.

21. A system according to claim 20, wherein the means for transforming the generator matrix to a similar matrix comprises means for multiplying an inverse matrix of the invertible matrix to the generator matrix.

22. A system according to claim 12, further comprising means for forming a pipeline architecture between the message and CRC result.

* * * * *